United States Patent
Zhang et al.

(10) Patent No.: US 10,629,638 B2
(45) Date of Patent: Apr. 21, 2020

(54) LTPS LAYER, METHOD FOR FABRICATING THE SAME, DISPLAY SUBSTRATE AND DISPLAY DEVICE

(71) Applicant: BOE TECHNOLOGY GROUP CO., LTD., Beijing (CN)

(72) Inventors: Huijuan Zhang, Beijing (CN); Dong Li, Beijing (CN); Xiaolong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/842,984

(22) Filed: Dec. 15, 2017

(65) Prior Publication Data

US 2018/0308878 A1  Oct. 25, 2018

(30) Foreign Application Priority Data

Apr. 19, 2017 (CN) .......................... 2017 1 0258068

(51) Int. Cl.
*H01L 29/04* (2006.01)
*H01L 27/12* (2006.01)
(Continued)

(52) U.S. Cl.
CPC .... *H01L 27/1285* (2013.01); *H01L 21/02422* (2013.01); *H01L 21/02488* (2013.01);
(Continued)

(58) Field of Classification Search
CPC ........ H01L 21/02422; H01L 21/02488; H01L 21/02532; H01L 21/02686;
(Continued)

(56) References Cited

U.S. PATENT DOCUMENTS 6,524,877 B1 * 2/2003 Nakazawa ............. H01L 27/12
257/40
2005/0012152 A1  1/2005 Park et al.
(Continued)

FOREIGN PATENT DOCUMENTS

CN     1681361 A   10/2005
CN   100517730 C    7/2009
(Continued)

OTHER PUBLICATIONS

First Office Action for Japanese Patent Application No. 201710258068.3 dated Apr. 28, 2019.

*Primary Examiner* — Robert G Bachner
(74) *Attorney, Agent, or Firm* — Calfee, Halter & Griswold LLP

(57) ABSTRACT

A method for fabricating a LTPS layer, a LTPS layer, a display substrate, and a display device are disclosed. The method includes providing a substrate which comprises a driver thin film transistor region and a non-driver thin film transistor region; depositing an amorphous silicon layer on the substrate; and irradiating the amorphous silicon layer with a laser beam to crystalline the amorphous silicon layer, wherein a scanning parameter with which the laser beam irradiates the amorphous silicon layer in the driver thin film transistor region is different from a scanning parameter with which the laser beam irradiates the amorphous silicon layer in the non-driver thin film transistor region. The driver and non-driver thin film transistor regions are processed in a differentiated manner with different scanning parameters. The amorphous silicon layer in the driver thin film transistor region is crystallized into a the grain size.

8 Claims, 3 Drawing Sheets

(51) Int. Cl.
  *H01L 21/02*    (2006.01)
  *H01L 29/786*   (2006.01)
  *H01L 29/66*    (2006.01)

(52) U.S. Cl.
  CPC .. *H01L 21/02532* (2013.01); *H01L 21/02686* (2013.01); *H01L 21/02691* (2013.01); *H01L 27/1229* (2013.01); *H01L 29/66757* (2013.01); *H01L 29/78675* (2013.01)

(58) Field of Classification Search
  CPC ........... H01L 21/02691; H01L 27/1229; H01L 27/1285; H01L 29/66757; H01L 29/78675
  See application file for complete search history.

(56)       References Cited

U.S. PATENT DOCUMENTS

| | | |
|---|---|---|
| 2005/0225253 A1 | 10/2005 | Yamada et al. |
| 2008/0090340 A1 | 4/2008 | Hsu et al. |
| 2008/0121894 A1 | 5/2008 | Hongo et al. |
| 2009/0001523 A1* | 1/2009 | Im .................... H01L 21/02422 257/627 |
| 2018/0040648 A1 | 2/2018 | Tian |

FOREIGN PATENT DOCUMENTS

| | | |
|---|---|---|
| CN | 104934372 A | 9/2015 |
| CN | 105206569 A | 12/2015 |

\* cited by examiner

LTPS LAYER, METHOD FOR FABRICATING THE SAME, DISPLAY SUBSTRATE AND DISPLAY DEVICE

RELATED APPLICATIONS

The present application claims the benefit of Chinese Patent Application No. 201710258068.3, filed Apr. 20, 2017, the entire disclosure of which is incorporated herein by

TECHNICAL FIELD

The present disclosure relates to the field of display technology, and particularly to a LTPS layer, a method for fabricating the same, a display device, and a display device.

BACKGROUND

In a flat display device such as a liquid crystal display device (LCD) and an organic light emitting display device (OLED), a thin film transistor (TFT) acts as a switch device and drive device. The flat display device generally comprises amorphous silicon TFT (a-Si TFT) or polycrystalline silicon TFT (p-Si TFT). a-Si TFT comprises an active layer formed by a-Si, while p-Si TFT comprises an active layer formed by p-Si.

As compared with a-Si, LTPS has significantly higher carrier mobility. This effectively y decreases an area of TFT, improves an aperture ratio. Furthermore, a LTPS display device has a quick response, higher resolution and display quality. LTPS has been widely applied to OLED, especially an active matrix light emitting display device (AMOLED).

Many processes, such as solid state crystallization (SPC), metal induced lateral crystallization (MILC), excimer laser crystallization (ELC) have been applied to fabricate LTPS. In the ELC process, a laser beam (shot) irradiates an amorphous silicon layer, so that amorphous silicon layer is molten in the irradiated region and recrystallized to form a polycrystalline silicon layer.

SUMMARY

An embodiment of the present disclosure provides a method for fabricating a LTPS layer, comprising: providing a substrate which comprises a driver thin film transistor region and a non-driver thin film transistor region; depositing an amorphous silicon layer on the substrate; and irradiating the amorphous silicon layer with a laser beam to crystalline the amorphous silicon layer into a polycrystalline silicon layer, wherein a scanning parameter with which the laser beam irradiates the amorphous silicon layer in the driver thin film transistor region is different from a scanning parameter with which the laser beam irradiates the amorphous silicon layer in the non-driver thin film transistor region.

In an embodiment, the laser beam irradiates the amorphous silicon layer in the driver thin film transistor region with a first pulse rate, the laser beam irradiates the amorphous silicon layer in the non-driver thin film transistor region with a second pulse rate, and the first pulse rate is smaller than the second pulse rate.

In an embodiment, the first pulse rate is ⅕-⅔ of the second pulse rate.

In an embodiment, the first pulse rate is 100 Hz-200 Hz, and the second pulse rate is 300 Hz-500 Hz.

In an embodiment, the first pulse rate is 100 Hz, and the second pulse rate is 300 Hz.

In an embodiment, the laser beam irradiates the amorphous silicon layer in the driver thin film transistor region with a first overlap rate, the laser beam irradiates the amorphous silicon layer in the non-driver thin film transistor region with a second overlap rate, and the first overlap rate is larger than the second overlap rate.

In an embodiment, the first overlap rate is larger than the second overlap rate by 4%-8%.

In an embodiment, the first overlap rate is 97%-98%, and large second overlap rate is 90%-93%.

In an embodiment, the first overlap rate is 97%, and the second overlap rate is 93%.

In an embodiment, the laser beam is generated by an excimer laser device, and has a wavelength in a range of 150 nm-400 nm.

In an embodiment, a scanning direction of the laser beam on the amorphous silicon layer is perpendicular with an extending direction of the driver thin film transistor region.

In an embodiment, after providing the substrate, and prior to depositing the amorphous silicon layer on the substrate, the method further comprises depositing a buffer layer on the substrate.

In an embodiment, the buffer layer is a single layer of silicon dioxide or silicon nitride, a stack comprising two layers of silicon dioxide and silicon nitride, or a stack comprising three or more layers in which silicon dioxide and silicon nitride are stacked alternately.

In an embodiment, depositing the buffer layer on the substrate comprises: depositing a silicon nitride layer on the substrate; and depositing a silicon oxide layer on the silicon nitride layer.

In an embodiment, the buffer layer has a thickness of 200-500 nm.

An embodiment of the present disclosure provides a LTPS layer for a display substrate, wherein the display substrate comprises a driver thin film transistor region and a non-driver thin film transistor region, and the LTPS layer has a grain size in the driver thin film transistor region which is larger than a grain size in the non-driver thin film transistor region.

An embodiment of the present disclosure provides a display substrate, comprising a driver thin film transistor which is arranged in a driver thin film transistor region and a non-driver thin film transistor which is arranged in a non-driver thin film transistor region, wherein the driver thin film transistor and the non-driver thin film transistor have an active layer comprises a LTPS layer, and the LTPS layer of the driver thin film transistor has a grain size larger than a grain size of the LTPS layer of the non-driver thin film transistor.

An embodiment of the present disclosure provides a display device, comprising the display substrate as mentioned above.

The LTPS layer, the display substrate, and the display device of the present disclosure embodiment have same or similar beneficial effects with the method for fabricating a LTPS layer in the above embodiments.

It will be understood that the above general description and the following detailed description are only exemplary and illustrative, and do not intend to limit the present disclosure in any way.

BRIEF DESCRIPTION OF THE DRAWINGS

These and other aspects of the invention are apparent from and will be further elucidated, by way of example, with the to the drawings, in which.

DETAILED DESCRIPTION OF EMBODIMENTS

This and other aspects of the present disclosure will now be described in more detail, with the to the appended drawings showing embodiments of the disclosure.

The numerals: 10 platform; 20 substrate to be processed; 20D driver thin film transistor region; 20N non-driver thin film transistor region; 30 laser device; 40, 40(N), 40(N+1) laser beam; D1 moving direction; D2 scanning direction; 100 substrate; 102 buffer layer; 104 amorphous silicon layer; 104a region which has been scanned; 104b region being scanned; 104c region to be scanned; 106 polycrystalline silicon layer; 108 active layer; 110 gate insulating layer; 112 gate; 114 interlayer dielectric layer; 116S source; 116D drain; 118 planarization layer; 120 first electrode; 130 pixel defining layer; 140 functional layer; 150 second electrode; 160 encapsulating substrate.

Figure 1:
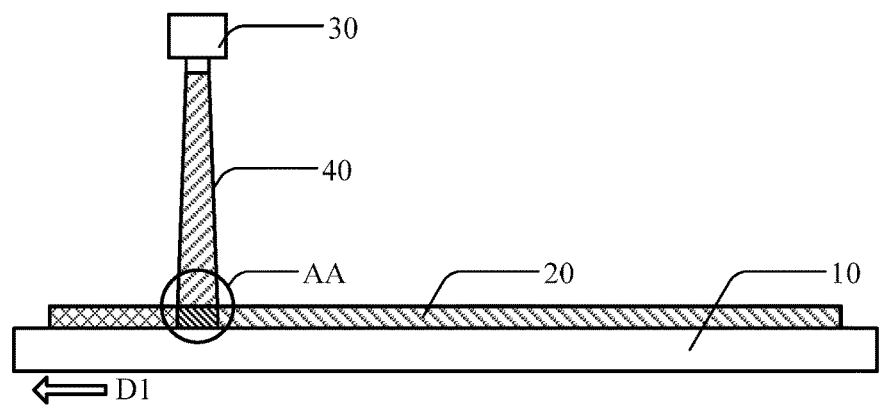
FIG. 1 is a structural view for illustrating an excimer laser crystallization system in an embodiment of the present disclosure.

FIG. 1 shows an excimer laser crystallization system in an embodiment of the present disclosure. As shown in FIG. 1, the excimer laser crystallization system comprises a platform 10. A substrate to be processed 20 is carried on the platform 10.

The excimer laser crystallization system further comprises a driving mechanism (not shown), for driving the platform 10 to move, for example in a horizontal plane. As shown, the platform 10 is driven by the driving mechanism to move along a moving direction D1, and the substrate to be processed 20 which is carried on the platform 10 moves accordingly along the moving direction D1. In an embodiment, the substrate to be processed 20 has a substantially rectangle shape, and the moving direction D1 is parallel with a side of the substrate to be processed 20.

The excimer laser crystallization system further comprises a laser device 30. During operation, the laser device 30 generates a pulsed laser beam 40 for irradiating the substrate to be processed 20. The laser device 30 is generally an excimer laser device. In the excimer laser device, a gas mixture forming an excimer system generally comprises diatomic noble gases, diatomic noble gas halides, triatomic noble gas halides, or the like. The diatomic noble gases for example comprise $Ar_2$, $Kr_2$, $Xe_2$, or the like. The diatomic noble gas halides for example comprise ArF, ArCl, KrF, KrCl, XeF, XeCl, or the like. The triatomic noble gas halides for example comprise $Kr_2F$, $Xe_2F$, $Xe_2Cl$, or the like.

The laser beam 40 generated by the laser device 30 has a wavelength in a range of 150 nm-400 nm. In embodiments of the present disclosure, the laser device 30 for example is an ArF excimer laser device with a wavelength of 193 nm, a KrF excimer laser device with a wavelength of 248 nm, a XeCl excimer laser device with a wavelength of 308 nm, and a XeF excimer laser device with a wavelength of 351 nm.

Figure 2:
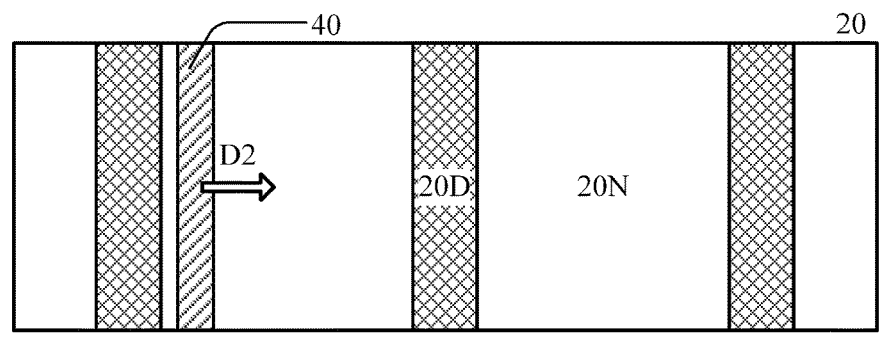
FIG. 2 is a top view for illustrating a substrate to be processed in an embodiment of the present disclosure.

FIG. 2 shows a substrate to be processed in an embodiment of the present disclosure. As described above, the platform 10 is driven by the driving mechanism to move along the moving direction D1, and the substrate to be processed 20 accordingly moves along the moving direction D1. When the substrate to be processed 20 is move, the laser device 30 and the laser beam 40 generated thereby keep still. This is equivalent that the laser beam 40 scans the substrate 20 along a scanning direction D2 which is opposite to the moving direction D1. As shown, a projection of the laser beam 40 on a surface of the substrate to be processed 20 has a linear shape or an elongated rectangle. Generally, the scanning direction D2 of the laser beam 40 is perpendicular with the extending direction of the linear shape or rectangle.

The substrate to be processed 20 comprises a driver thin film transistor region 20D and a non-driver thin film transistor region 20N. For example, in the driver thin film transistor region 20D, an amorphous silicon layer is subject to the ELC process to form a polycrystalline silicon layer which is used to form an active layer of the driver thin film transistor, while in the non-driver thin film transistor region 20N, the formed polycrystalline silicon layer is used to form an active layer of the non-driver thin film transistor. In the case shown in FIG. 2, the laser beam 40 is scanning a portion of the non-driver thin film transistor region 20N. In this context, the non-driver thin film transistor comprises, but is not limited to, a display thin film transistor. The non-driver thin film transistor comprises any transistor comprising an active layer which is formed by the polycrystalline silicon layer in the non-driver thin film transistor region, and comprises, but is not limited to, a switch transistor, a reset transistor, a compensating transistor or a light emitting control transistor in a pixel driving circuit. Apart from the active layer for forming the non-driver thin film transistor, the polycrystalline silicon layer in the non-driver thin film transistor region can further form other component and functional layers, for example, plates for a storage capacitor.

It is noted that, the driver thin film transistor significantly affects the electrical property of the display device. For example, in the OLED, the driver thin film transistor operates in the saturation region and outputs a drive current for driving the OLED to emit light. The drive current is relevant with carrier mobility and threshold voltage of the driver thin film transistor. The brightness of OLED is proportional with the drive current. Thus, it is generally desired to increase the carrier mobility and/or decrease the threshold voltage, so as to supply a the drive current to the OLED, and thus realize improved display effect.

Figure 3:
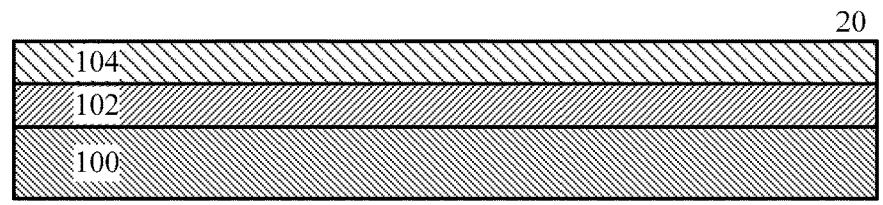
FIG. 3 is a cross-sectional view for illustrating a substrate to be processed in an embodiment of the present disclosure.

FIG. 3 shows a substrate to be processed in an embodiment of the present disclosure. As shown, the substrate to be processed 20 comprises the substrate 100 and an amorphous silicon layer 104 formed on the substrate 100. The substrate 100 for example is an alkali-free glass substrate, a resin substrate, a quartz substrate, or the like. The amorphous silicon layer 104 for example has a thickness of 40 nm-60 nm.

The substrate to be processed 20 for example further comprises the buffer layer 102 which is arranged between the substrate 100 and the amorphous silicon layer 104. The buffer layer 102 helps to prevent impurities in the substrate 100 from entering the amorphous silicon layer 104, and thus affecting performance of polycrystalline silicon layer which will be formed subsequently. In an embodiment, the buffer layer 102 is a single layer of silicon dioxide or silicon nitride. In another embodiment, the buffer layer 102 is a stack comprising two layers of silicon dioxide and silicon nitride. In yet another embodiment, the buffer layer 102 is a stack comprising three or more layers of silicon dioxide and silicon nitride which are arranged alternately.

In an embodiment, the buffer layer 102 has a total thickness of 200-500 nm. In this case, the buffer layer 102 decreases the heat conduction capability of the substrate to be processed 20, slows down heat release from the amorphous silicon layer 104 (especially in a region being irradiated by the laser beam 40), so that after the amorphous silicon layer 104 is molten by irradiation, the temperature is maintained. This facilitates the amorphous silicon layer 104 is converted into polycrystalline silicon with an increased grain size.

Figure 4:
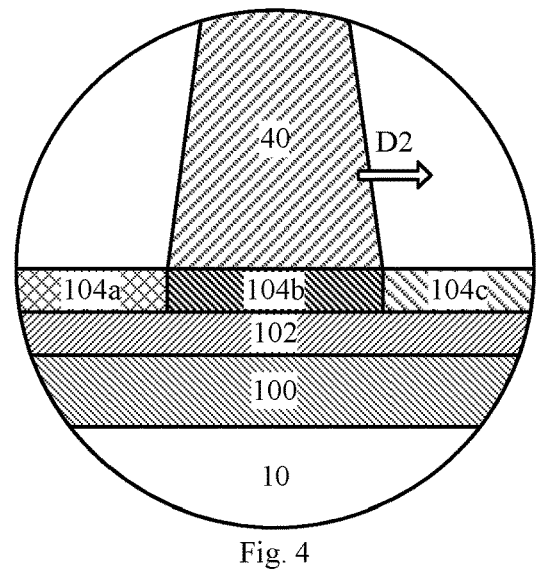
FIG. 4 is a schematic view for illustrating an AA region in FIG. 1.

FIG. 4 shows an AA region in FIG. 1. The laser beam 40 generated by the laser device 30 scans the substrate to be processed 20 along the scanning direction D2. As shown in FIGS. 1 and 4, the laser beam 40 generally has a trapezoidal cross section. The laser beam 40 is irradiating a region of the amorphous silicon layer 104, i.e., a region being scanned 104b. Energy of the laser beam 40 is absorbed by this region through a surface, and the temperature rises quickly, so that the amorphous silicon is converted into liquid silicon. The molten region quickly extends inside the amorphous silicon layer 104, so that after irradiation of the laser beam 40, a molten layer of a certain thickness is formed at the surface of the amorphous silicon layer 104. When the laser beam 40 stops irradiating, the molten layer start cooling gradually, forming a polycrystalline silicon layer. For example, in FIG. 4, in a region which has been scanned 104a, amorphous silicon in the amorphous silicon layer 104 has been converted into polycrystalline silicon, and in a region to be scanned 104c, amorphous silicon in the amorphous silicon layer 104 will be converted into polycrystalline silicon by irradiation with the laser beam 40.

Figure 5:
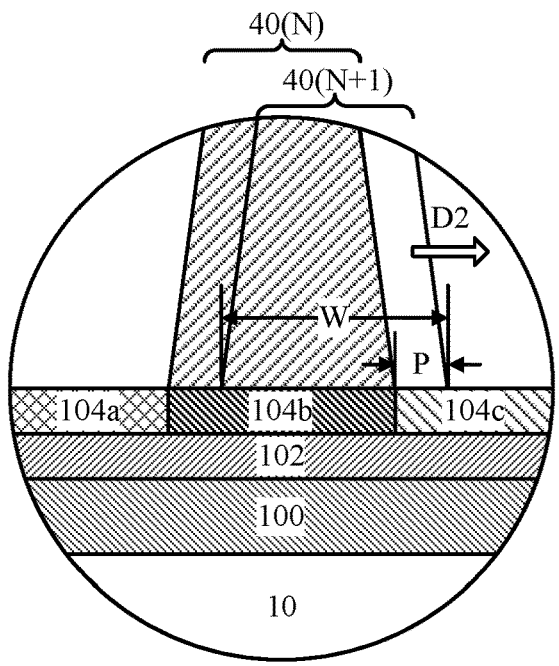
FIG. 5 is a cross-sectional view for illustrating an amorphous silicon layer being scanned by a laser beam in an embodiment of the present disclosure.

FIG. 5 shows an amorphous silicon layer being scanned by a laser beam in an embodiment of the present disclosure. Similarly, FIG. 5 is a local view of the AA region in FIG. 1. In the case as shown, the laser beam 40(N) stops irradiating the amorphous silicon layer 104, the amorphous silicon layer 104 form a polycrystalline silicon layer 106 in the irradiated region, and the next laser beam 40(N+1) has just irradiated on the amorphous silicon layer 104. For simplicity, only the region which has been scanned 104a, the region being scanned 104b, and the region to be scanned 104c of the amorphous silicon layer 104 are shown in FIG. 5 with respect to the laser beam 40(N).

A width of each laser beam 40 on the surface of the substrate to be processed 20 along the scanning direction D2 is defined as a scanning width W. The scanning width W also indicates a width of surface region which is scanned by each laser beam 40. The scanning width W generally for example is in a range of several micrometers to several hundreds of micrometers.

A distance between two neighboring laser beams 40(N), 40(N+1) is defined as a scanning pitch P. For example, the scanning pitch P refers to a distance between a right boundary of the surface region scanned by the $N^{th}$ laser beam 40(N) and a right boundary of the surface region scanned by the $(N+1)^{th}$ laser beam 40(N+1), as shown in FIG. 5. Alternatively, the scanning pitch P can also refer to a distance between a left boundary of the surface region scanned by the $N^{th}$ laser beam 40(N) and a left boundary of the surface region scanned by the $(N+1)^{th}$ laser beam 40(N+1).

In the present disclosure, an overlap rate of the laser beam is defined as (1−P/W)*100%.

A method for fabricating a LTPS layer according to an embodiment of the present disclosure will be described hereinafter by a flow chart of FIG. 6.

Figure 6:
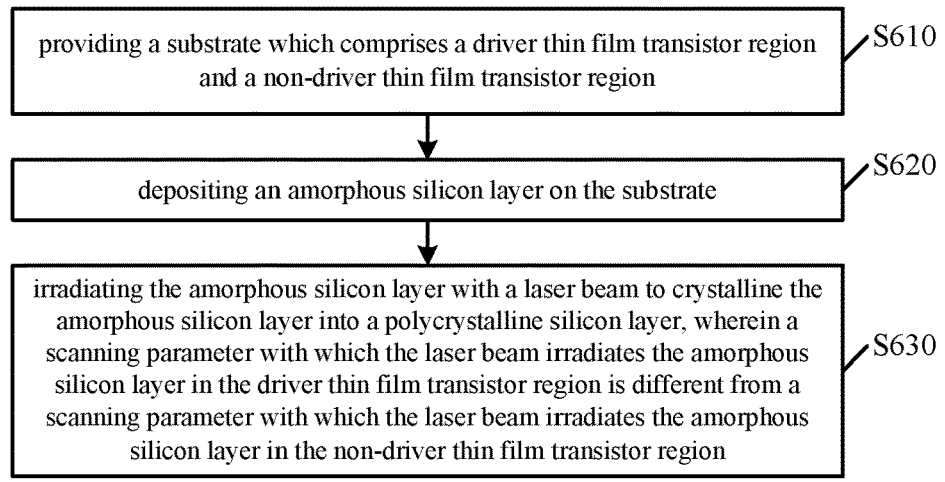
FIG. 6 is a flow chart for illustrating a method for fabricating a LTPS layer in an embodiment of the present disclosure.

As shown in FIG. 6, for example, a method for fabricating a LTPS layer comprises step S610, S620 and S630.

Step S610 comprises providing a substrate which comprises a driver thin film transistor region and a non-driver thin film transistor region.

As shown in FIGS. 2-3, the substrate 100 is provided. For example, the substrate 100 comprises a driver thin film transistor region and a non-driver thin film transistor region. It is noted that, the driver thin film transistor region and the non-driver thin film transistor region of the substrate 100 correspond with the driver thin film transistor region 20D and the non-driver thin film transistor region 20N of the substrate to be processed 20, and similarly correspond with the driver thin film transistor region and the non-driver thin film transistor region of the display substrate.

Step S620 comprises depositing an amorphous silicon layer on the substrate.

As shown in FIGS. 2-3, on the substrate 100 deposit the amorphous silicon layer 104. In an embodiment, the amorphous silicon layer 104 is deposited on the substrate 100 by a method like plasma enhanced chemical vapor deposition (PECVD). For example, the amorphous silicon layer 104 has a thickness of 40 nm-60 nm, and the thickness can be set as desired.

In an embodiment, step S620 further comprises, prior to depositing the amorphous silicon layer, cleaning the substrate 100, so that the surface of the substrate 100 is clean.

In an embodiment, step S620 further comprises, prior to depositing the amorphous silicon layer, depositing the buffer layer 102 on the substrate 100. For example, the buffer layer 102 has a thickness of 200-500 nm.

In an embodiment, the buffer layer 102 is a stack comprising two layers of silicon dioxide and silicon nitride, wherein the stack comprises a silicon dioxide layer contacting the amorphous silicon layer 104 and a silicon nitride layer contacting the substrate 100. Silicon dioxide facilitates forming a high quality polycrystalline silicon layer in the subsequent process, while silicon nitride can effectively block contaminants from the substrate 100. Thus, the buffer layer 102 with this configuration is beneficial.

Step S630 comprises, irradiating the amorphous silicon layer with a laser beam to crystalline the amorphous silicon layer into a polycrystalline silicon layer, wherein a scanning parameter with which the laser beam irradiates the amorphous silicon layer in the driver thin film transistor region is different from a scanning parameter with which the laser beam irradiates the amorphous silicon layer in the non-driver thin film transistor region.

In an embodiment, step S630 further comprises dehydrogenating the amorphous silicon layer 104 in an annealing furnace.

Figure 7A:
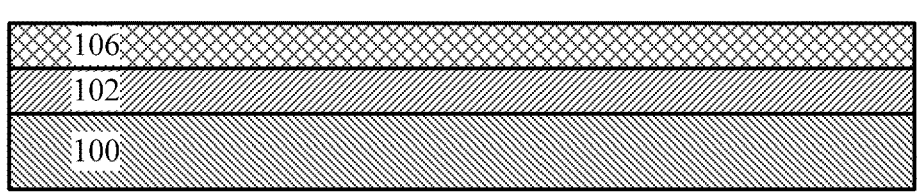
FIGS. 7A, 7B, 7C and 7D are cross-sectional views for illustrating a thin film transistor at stages in a fabricating process in an embodiment of the present disclosure.

As shown in FIGS. 2-3, 7A, the laser beam 40 irradiates the amorphous silicon layer 104, so that the amorphous silicon layer 104 is crystallized into the polycrystalline silicon layer 106. In an embodiment, a scanning parameter with which the laser beam 40 irradiates the amorphous silicon layer 104 in the driver thin film transistor region 20D is different from a scanning parameter with which the laser beam 40 irradiates the amorphous silicon layer 104 in the non-driver thin film transistor region 20N.

In embodiments of the present disclosure, different scanning parameters are used for the laser beam to scan the driver thin film transistor region and the non-driver thin film transistor region. The scanning parameter with which the laser beam scans the driver thin film transistor region is favorable to improve performance of polycrystalline silicon layer formed in this region. Although the scanning parameter may potentially decrease productivity of the system for fabricating the polycrystalline silicon layer, since the ratio of driver thin film transistor region in the substrate to be processed is limited, this would not lead to significant decrease in the productivity. In other words, the driver thin film transistor region and the non-driver thin film transistor region are processed in a differentiated manner with different scanning parameters of the laser beam. In this way, by taking the productivity into account, the amorphous silicon layer in the driver thin film transistor region is crystallized into a the grain size, the carrier mobility improves, and the driver thin film transistor which is formed subsequently has an improved electrical property.

For example, the laser device 30 is a XeCl excimer laser. This excimer laser has a long laser wavelength, so as to inject the laser energy into a deep position of amorphous silicon layer to provide improved crystallization effect.

In an embodiment of the present disclosure, the laser beam for example has an energy density of 200 mJ/cm$^2$-500 mJ/cm$^2$. In an embodiment, the laser beam has an energy density of 300 mJ/cm$^2$-450 mJ/cm$^2$. In an embodiment, the laser beam has an energy density of 400 mJ/cm$^2$-450 mJ/cm$^2$.

In an embodiment, the laser beam irradiates the amorphous silicon layer in the driver thin film transistor region with a first pulse rate, the laser beam irradiates the amorphous silicon layer in the non-driver thin film transistor region with a second pulse rate, and the first pulse rate is smaller than the second pulse rate.

In an embodiment, the first pulse rate is ⅓-⅔ of the second pulse rate. In an embodiment, the first pulse rate is 100 Hz-200 Hz, and the second pulse rate is 300 Hz-500 Hz. In an embodiment, the first pulse rate is 100 Hz, and the second pulse rate is 300 Hz.

In an embodiment, the laser beam irradiates the amorphous silicon layer in the driver thin film transistor region with a first overlap rate, the laser beam irradiates the amorphous silicon layer in the non-driver thin film transistor region with a second overlap rate, and the first overlap rate is larger than the second overlap rate. The laser beam scans the driver thin film transistor region with an increased overlap rate, so that on average amorphous silicon in the driver thin film transistor region is subjected to irradiation with the laser beam for an increased duration. This is favorable for improving crystallization effect of amorphous silicon in the driver thin film transistor region, namely, increasing grain size of polycrystalline silicon. Furthermore, increasing the overlap rate of laser beam is also favorable for improving homogeneity of p-Si layer in the driver thin film transistor region. In this case, the driver thin film transistor with an active layer formed by the p-Si layer in the driver thin film transistor region has an improved threshold voltage homogeneity. This is favorable for improving homogeneity of drive current, and further improving display homogeneity of a display device such as OLED.

In an embodiment, the first overlap rate is larger than the second overlap rate by 4%-8%, for example 4%, 5%, 6%, 7%, 8%. As understood by a person with ordinary skill in the art, the overlap rate is non-dimensional, and is generally expressed by a percentage. For example, the first overlap rate is larger than the second overlap rate by 4% indicates that the first overlap rate=the second overlap rate+4%. In an embodiment, the first overlap rate is 97%-98%, and the second overlap rate is 90%-93%. In an embodiment, the first overlap rate is 97%, and the second overlap rate is 93%.

Based on the above embodiment, an embodiment of the present disclosure provides a LTPS layer for a display substrate, wherein the display substrate comprises a driver thin film transistor region and a non-driver thin film transistor region, and the LTPS layer has a grain size in the driver thin film transistor region which is larger than a grain size in the non-driver thin film transistor region.

The above method for fabricating a LTPS layer will be described with the to two embodiments.

In a first embodiment, the buffer layer 102 consisting of silicon dioxide and silicon nitride is deposited by PECVD on the substrate 100 such as glass or polyimide (PI), and then the amorphous silicon layer 104 with a thickness of 40 nm-60 nm is deposited. In this way, the substrate to be processed 20 is formed. The substrate to be processed 20 is loaded into an annealing furnace, and the amorphous silicon layer 104 on the substrate 100 is subject to a dehydrogenation treatment.

The substrate to be processed 20 is scanned by the laser beam 40 with an energy density of 400 mJ/cm$^2$-450 mJ/cm$^2$ in an ELC process. For example, the laser beam 40 starts scanning at an edge of the substrate to be processed 20. The non-driver thin film transistor region 20N is generally located at the edge of the substrate to be processed 20, and thus a normal overlap rate like 93% is used for scanning this region.

As shown in FIG. 1, the substrate to be processed carried on the platform 10 is caused to move along the moving direction D1, by moving the platform 10. When the substrate to be processed 20 travels along the moving direction D1 by a distance (this distance depends on a design margin between the driver thin film transistor and the edge of the substrate to be processed 20, e.g., 175 μm), the laser beam 40 starts scanning the driver thin film transistor region 20D of the substrate to be processed 20. In the driver thin film transistor region 20D, the laser beam 40 has an overlap rate which for example increases to 97%. The substrate to be processed 20 travels along the moving direction D2 by a distance about 10 μm, and the distance is slightly larger than an in-plane width of the driver thin film transistor, so as to complete the scanning of the driver thin film transistor region 20D at an increased overlap rate of for example 97%. When the platform 10 continues to travel along the moving direction D1 to the non-driver thin film transistor region 20N, the region is scanned with a normal overlap rate of for example 93%. The above processes are repeated, up to the whole substrate to be processed 20 is scanned.

In second embodiment, the buffer layer 102 consisting of silicon dioxide and silicon nitride is deposited by PECVD on the substrate 100 such as glass or polyimide (PI), and then the amorphous silicon layer 104 with a thickness of 40 nm-60 nm is deposited. In this way, the substrate to be processed 20 is formed. The substrate to be processed 20 is loaded into an annealing furnace, and the amorphous silicon layer 104 on the substrate 100 is subject to a dehydrogenation treatment.

The substrate to be processed 20 is scanned by the laser beam 40 with an energy density of 400 mJ/cm$^2$-450 mJ/cm$^2$ in an ELC process. For example, the laser beam 40 starts scanning at an edge of the substrate to be processed 20. The non-driver thin film transistor region 20N is generally located at the edge of the substrate to be processed 20, and thus a normal overlap rate like 93% is used for scanning this region.

As shown in FIG. 1, the substrate to be processed carried on the platform 10 is caused to move along the moving direction D1, by moving the platform 10. When the substrate to be processed 20 travels along the moving direction D1 by a distance (this distance depends on a design margin between the driver thin film transistor and the edge of the substrate to be processed 20, e.g., 175 μm), the laser beam 40 starts scanning the driver thin film transistor region 20D of the substrate to be processed 20. In the driver thin film transistor region 20D, the laser beam 40 has a frequency which for example decreases to 100 Hz. The substrate to be processed 20 travels along the moving direction D2 by a distance about 10 μm, and the distance is slightly larger than an in-plane width of the driver thin film transistor, so as to complete the scanning of the driver thin film transistor region 20D at an decreased frequency of for example 100 Hz. When the platform 10 continues to travel along the moving direction D1 to the non-driver thin film transistor region 20N, the region is scanned with a normal frequency of for example 300 Hz. The above processes are repeated, up to the whole substrate to be processed 20 is scanned.

In the above first and second embodiments, the laser beam 40 scans the driver thin film transistor region 20D and the non-driver thin film transistor region 20N with different scanning parameters. In particular, in the first embodiment, the laser beam 40 scans the non-driver thin film transistor region 20N with a normal overlap rate, while scans the driver thin film transistor region 20D with an increased overlap rate. In the second embodiment, the laser beam 40 scans the non-driver thin film transistor region 20N with a normal frequency, while scans the driver thin film transistor region 20D with a decreased frequency.

In the above embodiments, the driver thin film transistor region is scanned by a laser beam with an increased overlap rate or decreased frequency, so that the driver thin film transistor region has a crystallization effect significantly superior over the non-driver thin film transistor region. This is favorable for increasing grain size of polycrystalline silicon in the driver thin film transistor region, improving mobility of the driver thin film transistor, decreasing the current leakage, and avoiding strip-shaped display defects (mura) in the subsequently formed display device.

Furthermore, since the process is only modified in a small region of the driver thin film transistor region, the productivity will not be affected significantly. In particular, in the above embodiment, crystallization quality can be significantly improved by adjusting the overlap rate and scan frequency of laser beam. Although the increase in overlap rate and decrease in scan frequency potentially decreases productivity, such an increase or decrease is limited to the driver thin film transistor region, and thus does not lead to significant decrease in productivity.

As known by the person with ordinary skill in the art, in the ELC process, scanning parameters such as laser beam output wavelength, pulse width, energy distribution, energy homogeneity may also affect the crystallization effect of polycrystalline silicon layer. These also fall within the scope of the present disclosure.

The LTPS fabricated by the above method of the present disclosure can be applied to an active layer of LTPS TFT, and the LTPS TFT can be applied to a display substrate, to form a display device such as an AMOLED and LTPS thin film transistor liquid crystal display device (LTPS TFT LCD).

An embodiment of the present disclosure provides a display substrate. The display substrate comprises a driver thin film transistor which is arranged in a driver thin film transistor region and a non-driver thin film transistor which is arranged in a non-driver thin film transistor region, wherein the driver thin film transistor and the non-driver thin film transistor have an active layer comprises a LTPS layer, and the LTPS layer of the driver thin film transistor has a grain size larger than a grain size of the LTPS layer of the non-driver thin film transistor.

A process for fabricating a thin film transistor according to an embodiment of the present disclosure will be described with the to FIGS. 7A, 7B, 7C and 7D.

As shown in FIG. 7A, an amorphous silicon layer is formed on the substrate 100, and the amorphous silicon layer is formed into the polycrystalline silicon layer 106 by the method described in the above embodiments.

As described above, in an embodiment, prior to forming the amorphous silicon layer, the step can further comprise form the buffer layer 102 on the substrate 100 (as shown in FIG. 3). For example, the buffer layer 102 has a total thickness of 200-500 nm. For example, the buffer layer 102 is a stack comprising two layers of silicon dioxide and silicon nitride.

Figure 7B:
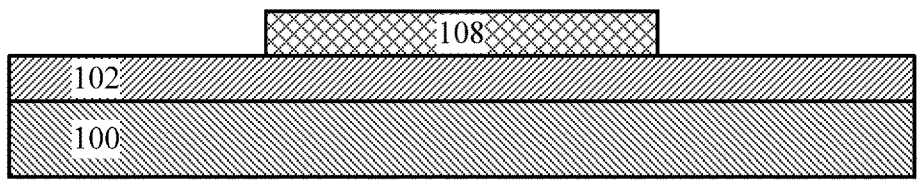

As shown in FIG. 7B, the polycrystalline silicon layer 106 is subject to a patterning process, to form a pattern of the active layer 108.

The patterning process in this context comprises photoresist coating, exposure, development, etching, photoresist peeling off, or the like. Steps of photoresist coating or the like are known by the person with ordinary skill in the art, and thus are not described herein.

Figure 7C:
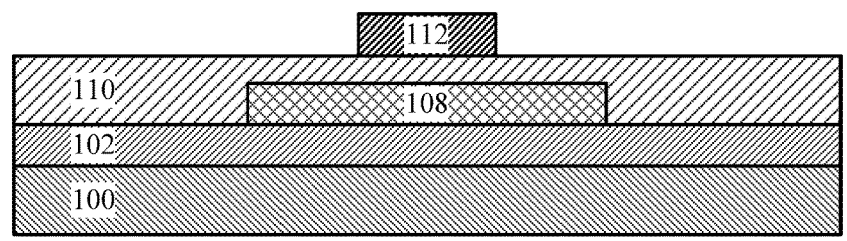

As shown in FIG. 7C, on the substrate 100 on which the pattern of active layer 108 has been formed, a gate insulating layer 110 is formed, and a pattern comprising a gate 112 is formed on the gate insulating layer 110.

For example, the gate insulating layer 110 is deposited by PECVD. Then, a gate metallic layer is formed by sputtering or evaporation, and the gate metallic layer is patterned to form a pattern comprising the gate 112.

Figure 7D:
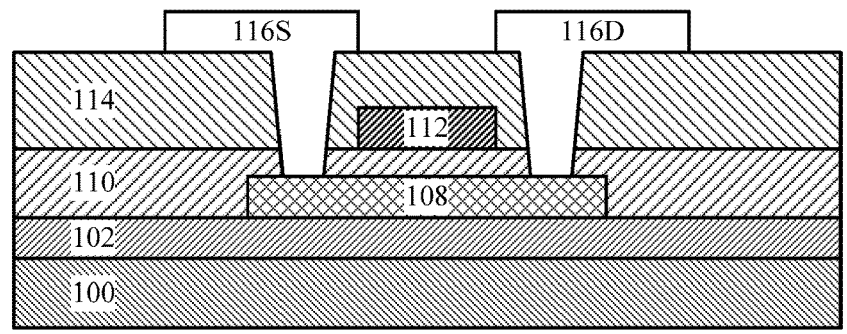

As shown in FIG. 7D, on the substrate 100 on which the pattern comprising the gate 112 has been formed, an interlayer dielectric layer 114 is formed, and is formed into a source 116S and a drain 116D which are connected with the active layer 108.

For example, the interlayer dielectric layer 114 is formed by PECVD. The interlayer dielectric layer 114 is patterned to form a first contact hole which penetrate the interlayer dielectric layer 114 and the gate insulating layer 110, so that a portion of the active layer 108 is exposed. Then, a metallic layer is formed by sputtering or evaporation, and is patterned to form a pattern comprising the source 116S and the drain 116D. The source 116S and the drain 116D are connected with the active layer 108 through the first contact hole. The thin film transistor is completed by the above process steps.

In the above embodiments, the is made to a thin film transistor of a bottom gate type. In embodiments of the present disclosure, the thin film transistor can also be of a top gate type.

A display substrate according to an embodiment of the present disclosure will be described with the to FIG. 8.

Figure 8:
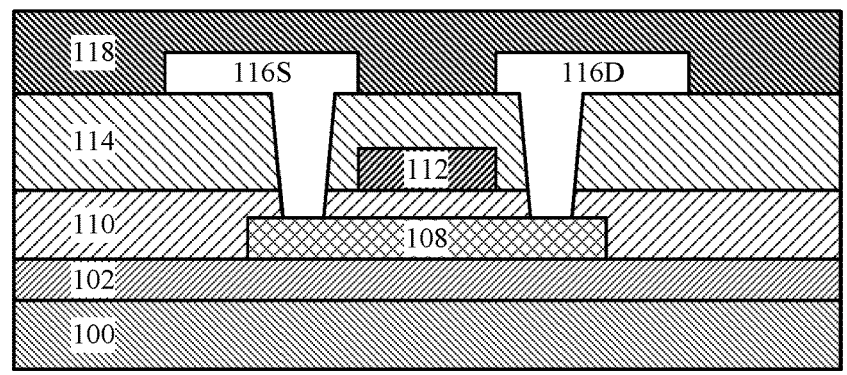
FIG. 8 is a cross-sectional view for illustrating a display substrate in an embodiment of the present disclosure.

As shown in FIG. 8, on the substrate 100 on which the thin film transistor has been formed as shown in FIG. 7D, a planarization layer 118 is formed. In an embodiment, the planarization layer 118 comprises an inorganic material such as silicon dioxide or silicon nitride, or an organic resin such as polymethyl methacrylate (PMMA). The display substrate is completed by the above process steps.

Figure 9:
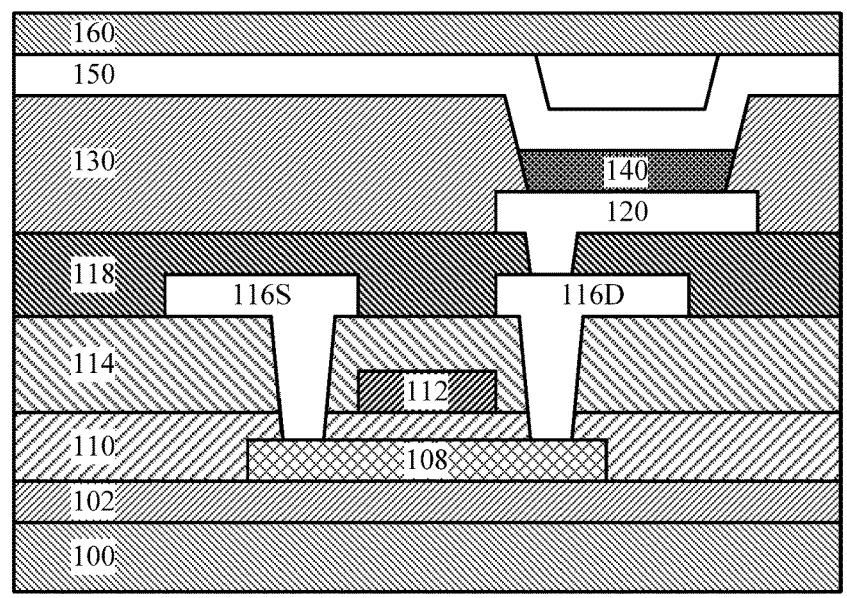
FIG. 9 is a cross-sectional view for illustrating a display device in an embodiment of the present disclosure.

A display device according to an embodiment of the present disclosure will be described with the to FIG. 9. As shown in FIG. 9, a second contact hole is formed in the display substrate shown in FIG. 8. The second contact hole penetrates the planarization layer 118, to expose a portion of the drain 116D. Then, a metallic layer is formed by sputtering or evaporation, and is patterned to form a first electrode 120. The first electrode 120 is connected with the drain 116D through the second contact hole. A pixel defining layer 130 is formed, and is patterned to expose a large surface region of the first electrode 120. Then, a functional layer 140 and a second electrode 150 are formed in this order on the display substrate. In an embodiment, the functional layer 140 comprises a hole inject layer, a hole transport layer, a light emitting layer, an electron transport layer, and/or an electron inject layer. The first electrode 120, the functional layer 140, and the second electrode 150 form an organic light emitting element. Optionally, the organic light emitting element is provided with an encapsulating substrate 160, thus forming a display device.

In the above embodiments, the display device has been described by taking OLED as an example. However, the display device of the present disclosure embodiment can also be a TFT LCD.

The inventors have fabricated polycrystalline silicon layers with the method as described in the above first and second embodiments, and have fabricated the display device shown in FIG. 9 with these polycrystalline silicon layers. In these display devices, the strip-shaped display defects (mura) have not been observed.

The display device in embodiments of the present disclosure can be any product or component with a display function like a liquid crystal panel, electronic paper, a mobile phone, tablet computer, TV, monitor, notebook computer, digital photo frame, navigator, or the like Embodiments of the present disclosure provide a method for fabricating a LTPS layer, a polycrystalline silicon layer fabricated by the method, a thin film transistor and a display device. The method comprises providing a substrate which comprises a driver thin film transistor region and a non-driver thin film transistor region; depositing an amorphous silicon layer on the substrate; and irradiating the amorphous silicon layer with a laser beam to crystalline the amorphous silicon layer into a polycrystalline silicon layer, wherein a scanning parameter with which the laser beam irradiates the amorphous silicon layer in the driver thin film transistor region is different from a scanning parameter with which the laser beam irradiates the amorphous silicon layer in the non-driver thin film transistor region. The driver thin film transistor region and the non-driver thin film transistor region are processed in a differentiated manner with different scanning parameters of the laser beam. In this way, by taking the productivity into account, the amorphous silicon layer in the driver thin film transistor region is crystallized into a the grain size, the carrier mobility improves, and the driver thin film transistor which is formed subsequently has an improved electrical property.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for fabricating a LTPS layer, comprising:
   providing a substrate which comprises a driver thin film transistor region and a non-driver thin film transistor region;
   depositing an amorphous silicon layer on the substrate; and
   irradiating the amorphous silicon layer with a laser beam to crystalline the amorphous silicon layer into a polycrystalline silicon layer, wherein a scanning parameter with which the laser beam irradiates the amorphous silicon layer in the driver thin film transistor region is different from a scanning parameter with which the laser beam irradiates the amorphous silicon layer in the non-driver thin film transistor region,
   wherein the laser beam irradiates the amorphous silicon layer in the driver thin film transistor region with a first pulse rate, the laser beam irradiates the amorphous silicon layer in the non-driver thin film transistor region with a second pulse rate, and the first pulse rate is smaller than the second pulse rate, and the first pulse rate is ⅕-⅔ of the second pulse rate, or
   wherein the laser beam irradiates the amorphous silicon layer in the driver thin film transistor region with a first overlap rate, the laser beam irradiates the amorphous silicon layer in the non-driver thin film transistor region with a second overlap rate, and the first overlap rate is larger than the second overlap rate, and the first overlap rate is larger than the second overlap rate by 4%-8%.

2. The method of claim 1, wherein the first pulse rate is 100 Hz-200 Hz, and the second pulse rate is 300 Hz-500 Hz.

3. The method of claim 2, wherein the first pulse rate is 100 Hz, and the second pulse rate is 300 Hz.

4. The method of claim 1, wherein the first overlap rate is 97%-98%, and the second overlap rate is 90%-93%.

5. The method of claim 4, wherein the first overlap rate is 97%, and the second overlap rate is 93%.

6. The method of claim 1, wherein the laser beam is generated by an excimer laser device, and has a wavelength in a range of 150 nm-400 nm.

7. The method of claim 1, wherein a scanning direction of the laser beam on the amorphous silicon layer is perpendicular with an extending direction of the driver thin film transistor region.

8. The method of claim 1, wherein after providing the substrate, and prior to depositing the amorphous silicon layer on the substrate, the method further comprises depositing a buffer layer on the substrate, the buffer layer is a single layer of silicon dioxide or silicon nitride, a stack comprising two layers of silicon dioxide and silicon nitride, or a stack comprising three or more layers in which silicon dioxide and silicon nitride are stacked alternately, and the buffer layer has a thickness of 200-500 nm.

* * * * *